(12) United States Patent
Qian

(10) Patent No.: US 6,323,606 B1
(45) Date of Patent: Nov. 27, 2001

(54) MONITOR DEFLECTION CIRCUIT

(75) Inventor: Jinrong Qian, Croton-on-Hudson, NY (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/749,726

(22) Filed: Dec. 27, 2000

(51) Int. Cl.$^7$ .................................................. G09G 1/04
(52) U.S. Cl. ................................... 315/408; 315/369
(58) Field of Search ................................... 315/408, 369, 315/399

(56) References Cited

U.S. PATENT DOCUMENTS

| | | | |
|---|---|---|---|
| 4,625,155 | 11/1986 | Dietz | 315/408 |
| 5,089,756 | 2/1992 | Hennig | 315/387 |
| 6,081,079 | * 6/2000 | Lee | 315/408 |

FOREIGN PATENT DOCUMENTS

| | | |
|---|---|---|
| 63189050 | 8/1988 | (JP) . |
| 355970 | 3/1991 | (JP) . |

* cited by examiner

Primary Examiner—David Vu
(74) Attorney, Agent, or Firm—Edward W. Goodman

(57) ABSTRACT

A monitor deflection circuit includes a bipolar power transistor for applying power from a high voltage supply to a horizontal deflection coil. The monitor deflection circuit further includes a base drive circuit for selectively turning the bipolar power transistor on and off. The base drive circuit includes a flyback transformer having a primary winding and a secondary winding coupled to the base of the bipolar power transistor, a voltage source coupled to one end of the primary winding, and a drive switch coupling the other end of the primary winding to ground. The base driver circuit further includes a constant current circuit coupled between the voltage source and the primary winding of the flyback transformer for controlling a base current of the bipolar power transistor before the bipolar power transistor conducts.

18 Claims, 6 Drawing Sheets

MONITOR DEFLECTION CIRCUIT

BACKGROUND OF THE INVENTION

1. Field of The Invention

The subject invention relates to a circuit for deflecting an electron beam in a monitor.

2. Description of The Related Art

As shown in FIG. 1, a conventional deflection circuit includes a bipolar power transistor BJT, a damping diode $D_r$, a retrace capacitor $C_r$, a horizontal deflection coil $L_y$, S-correction ID capacitor $C_s$ and a base driver circuit. The base driver circuit consists of a flyback isolation transformer T, damping resistors R1 and R2, a snubber circuit D1, R3 and C1, and a drive switch S1. FIG. 2 shows the key waveforms of the deflection circuit. In operation, the damping diode $D_r$, which is in anti-parallel with the bipolar transistor BJT, is turned on at $t_0$. The voltage $V_s$ is applied to the deflection coil $L_y$ and causes the deflection coil current $i_y$ to increase. The damping diode $D_r$ is turned off at zero voltage at $t_1$, where the deflection coil current $i_y$ reverses. The transistor BJT is then turned on and takes the deflection coil current. The drive switch S1 is turned on at $t_2$ and a negative voltage is applied to the base-emitter of the transistor BJT. After a storage time, the transistor BJT is turned off at $t_3$. The deflection coil $L_y$ and the retrace capacitor $C_r$ form a resonant circuit which generates a high voltage for resetting the deflection coil $L_y$. This high voltage $V_{ce,max}$ can be expressed as:

$$V_{ce,max} = V_s \left(1 + \frac{\pi}{2}\frac{t_s}{t_r}\right) \quad (1)$$

where $t_s$ and $t_r$ are the sweep time and retrace time, respectively.

Because the power transistor BJT has a large tail current, this overlaps the collector-emitter voltage and generates a high switching turn-off loss. In addition, high voltage rating power transistors have a small current gain $h_{fe}$ (the ratio of the collector current to the base current), which requires a high based current to turn the device on and off. Thus, the power loss in the base drive circuit is significant.

The waveform of the base current for the transistor BJT has a great influence on its power loss. Unlike majority carrier power switches, such as MOSFETs and IGBTs, the BJT requires high base current to turn the device on and off, especially for high voltage and high current bipolar transistors, which have low current gains, usually less than 10. For monitor applications, the collector current of the BJT linearly increases with the sweep time, as shown in FIG. 2. Thus, the required base drive current should follow the collector current waveshape to achieve optimum operation of the BJT. In other words, it needs the highest base drive current at the end of the horizontal sweep at t2, where the BJT conducts the highest deflection coil current. Besides, since the horizontal deflection circuit operates at a wide rage of frequencies, typically from 30 kHz to 86 kHz, and even 100 kHz for high resolution, the base drive circuit should be able to supply proper base current for the operating frequency range. The conventional base drive circuit employs a flyback transformer to supply base current to the bipolar transistor BJT and uses high turns ratio to reduce the current level in the circuit on the primary side. As shown in FIG. 2, when S1 is turned on, a negative voltage, generated in the secondary winding, is applied to the emitter-base junction and turns off the transistor BJT. The supply voltage is supplied in the primary winding, which causes the magnetizing current to increase. When the drive switch S1 is turned off, the magnetizing current is reflected to the secondary winding and used as the base current to turn on the transistor BJT. Because of the nature of the flyback transformer, the base current linearly decreases with the sweep time. With the increase of the collector current, the base current provided by the drive circuit is actually decreased. This is contradictory to the requirements, this high base current being needed for the high collector current. If the base current is kept high enough at the end of the sweep time of t2 to fully conduct the deflection coil current, then the transistor BJT is definitely overdriven at the beginning of the transistor BJT conduction. As a result, high power dissipation exists and high rating components have to be used in the base drive circuit, which consequently increases the cost.

SUMMARY OF THE INVENTION

It is an object of the present invention to provide a base drive circuit for a deflection circuit having a reduced power consumption for reducing the cost thereof.

It is a further object of the present invention to provide a simplified base drive circuit for a bipolar transistor having an optimum base current waveform.

It is a still further object of the present invention to provide a base drive circuit for supplying a base current proportional to the collector current with a wide range of operating frequencies.

The above objects are achieved in a monitor deflection circuit comprising a bipolar power transistor having a base, an emitter and a collector; a high voltage supply for providing a high voltage, said high voltage supply being coupled to the emitter of said bipolar power transistor; a parallel arrangement of a retrace capacitor and a damping diode arranged across the emitter and the collector of the bipolar power transistor; a series arrangement of a horizontal deflection yoke and an S-correction capacitor also arranged across the emitter and the collector of the bipolar transistor; a base driver circuit for driving the base of the bipolar power transistor, said base driver circuit including a flyback transformer having a primary winding and a secondary winding coupled to the base of the bipolar power transistor, a voltage source coupled to one end of the primary winding, and a drive switch coupling the other end of the primary winding to ground, wherein the base driver circuit further comprises a constant current circuit coupled between the voltage source and the primary winding of the flyback transformer for controlling a base current of the bipolar power transistor before the bipolar power transistor conducts.

Applicant has found that by including a constant current circuit to control the base current of the bipolar power transistor prior to it conducting, the base current is significantly reduced, which reduces the power dissipation.

BRIEF DESCRIPTION OF THE DRAWINGS

With the above and additional objects and advantages in mind as will hereinafter appear, the invention will be described with reference to the accompanying drawings, in which.

DESCRIPTION OF THE PREFERRED EMBODIMENTS

Figure 1:
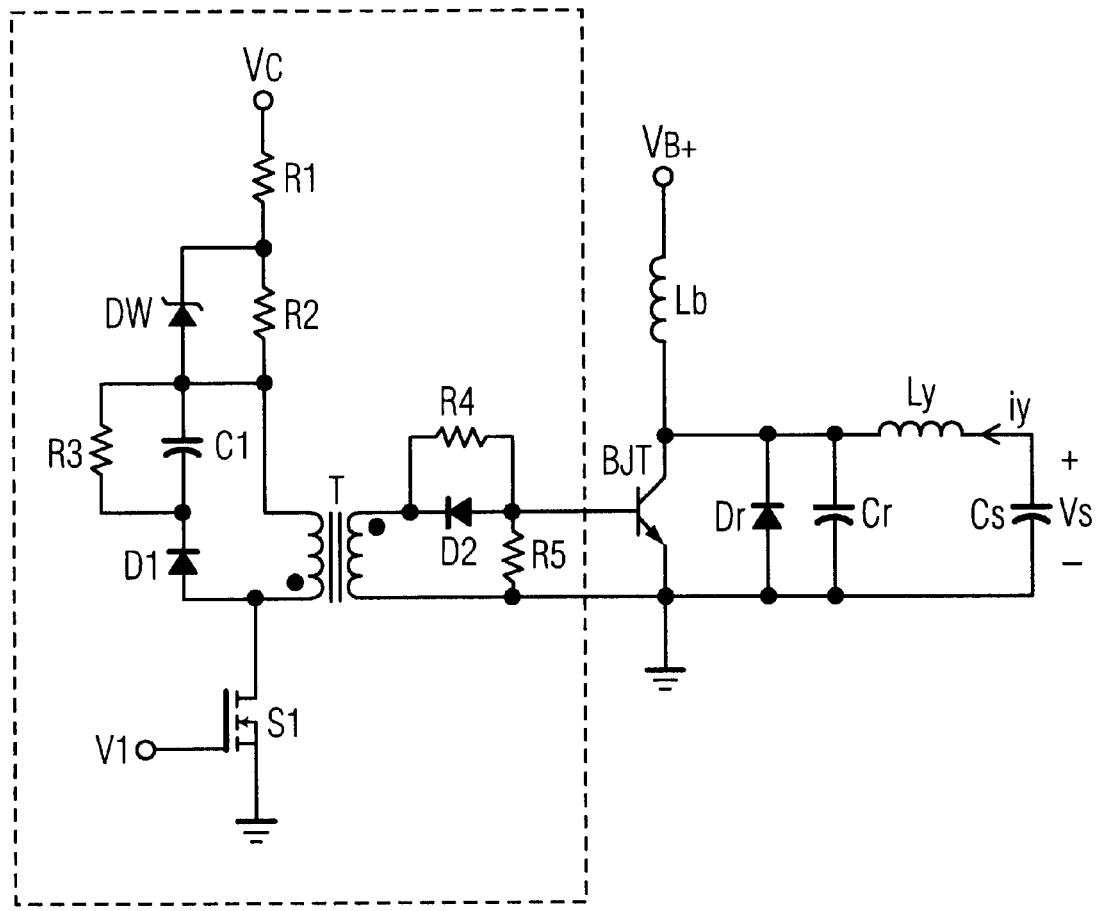
FIG. 1 is a schematic diagram of a known deflection circuit.
Figure 2:
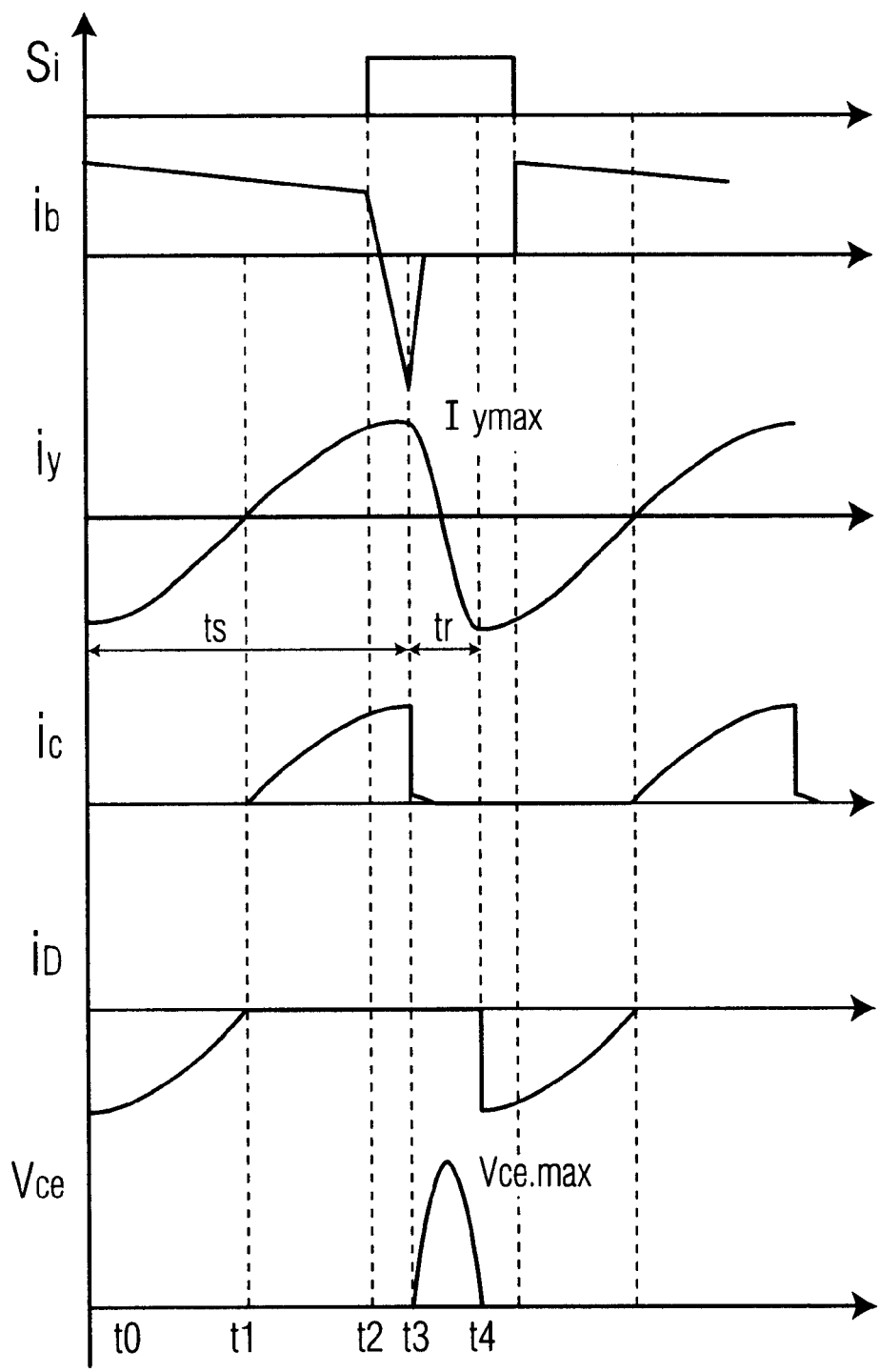
FIG. 2 shows typical waveforms in the deflection circuit of FIG. 1.
Figure 3:
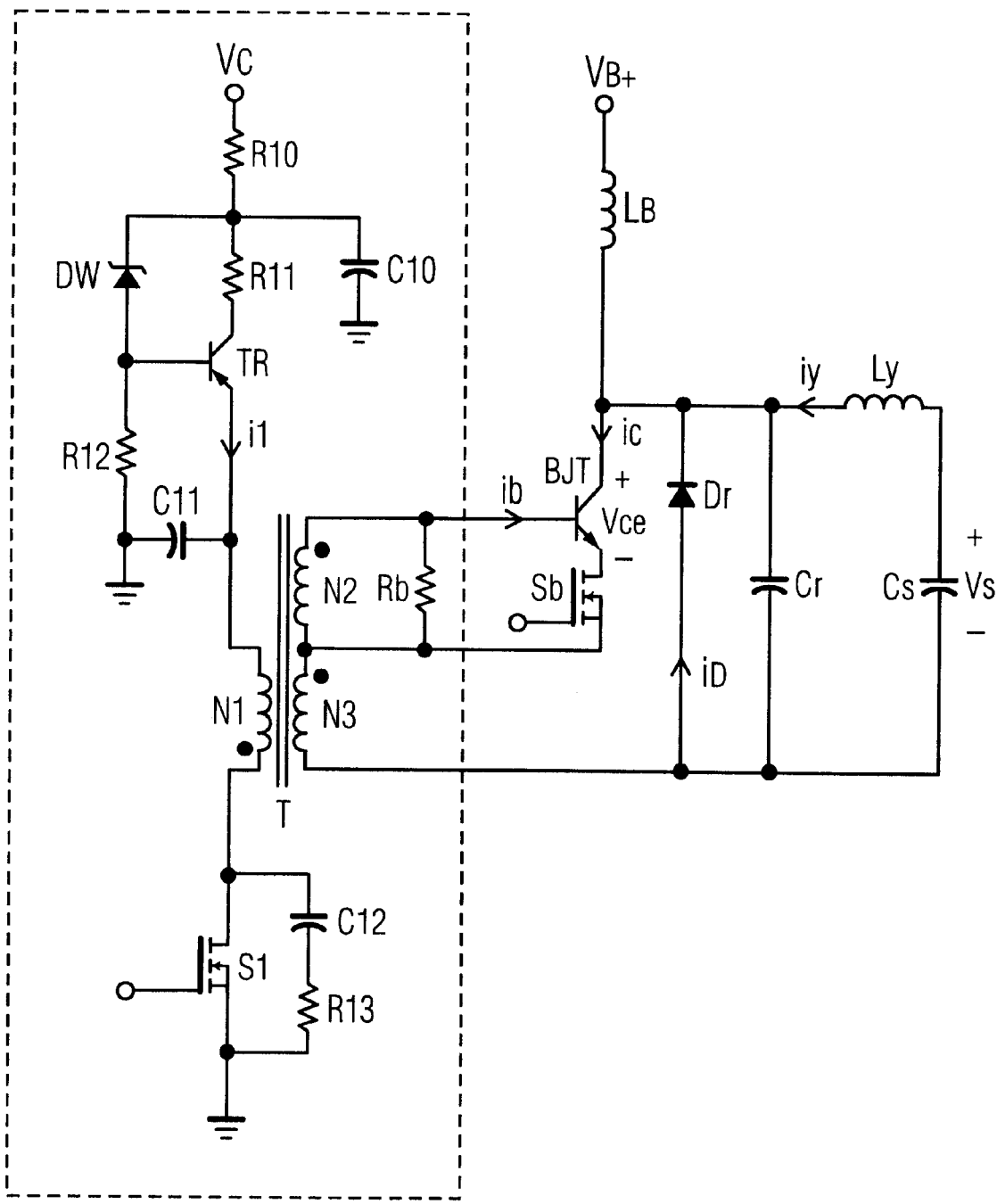
FIG. 3 shows a first embodiment of the deflection circuit of the subject invention.

FIG. 3 shows a first embodiment of the monitor deflection circuit which exhibits power loss reduction in the base drive circuit and the power transistor BJT. In the base drive circuit, a supply voltage $V_c$ is applied to the series arrangements of damping resistors R10 and R11 and to the emitter of PNP transistor TR. A zener diode DW connects the base of the transistor TR to the junction between the damping resistors R10 and R11, while a capacitor C10 connects this junction to ground. A resistor R12 connects the base to ground, while the collector of the transistor TR is connected to ground via a capacitor C11, and to end of a primary winding $N_1$ of flyback transistor T. The other end of the primary winding $N_1$ is connected to ground via the parallel arrangement of a drive switch S1, on the one hand, and a series arrangement of a capacitor C12 and a resistor R13.

The flyback transformer T has a first secondary winding $N_2$ which is shunted, on the one hand, by a resistor $R_b$ and, on the other hand, by the base-emitter of the power transistor BJT in series with a MOSFET $S_b$. A second secondary winding $N_3$ has one end connected to the low side of the first secondary winding $N_2$. A high voltage $V_{B+}$ is coupled to the collector of the transistor BJT through an inductor $L_B$. A parallel combination of a diode $D_r$ and a capacitor $C_r$ connects, the collector of the transistor BJT to the other end of the second secondary winding $N_3$. Finally, a series arrangement of the deflection coil $L_y$ and a capacitor $C_s$ connect the collector of the transistor BJT to the other end of the secondary winding $N_3$.

Figure 4:
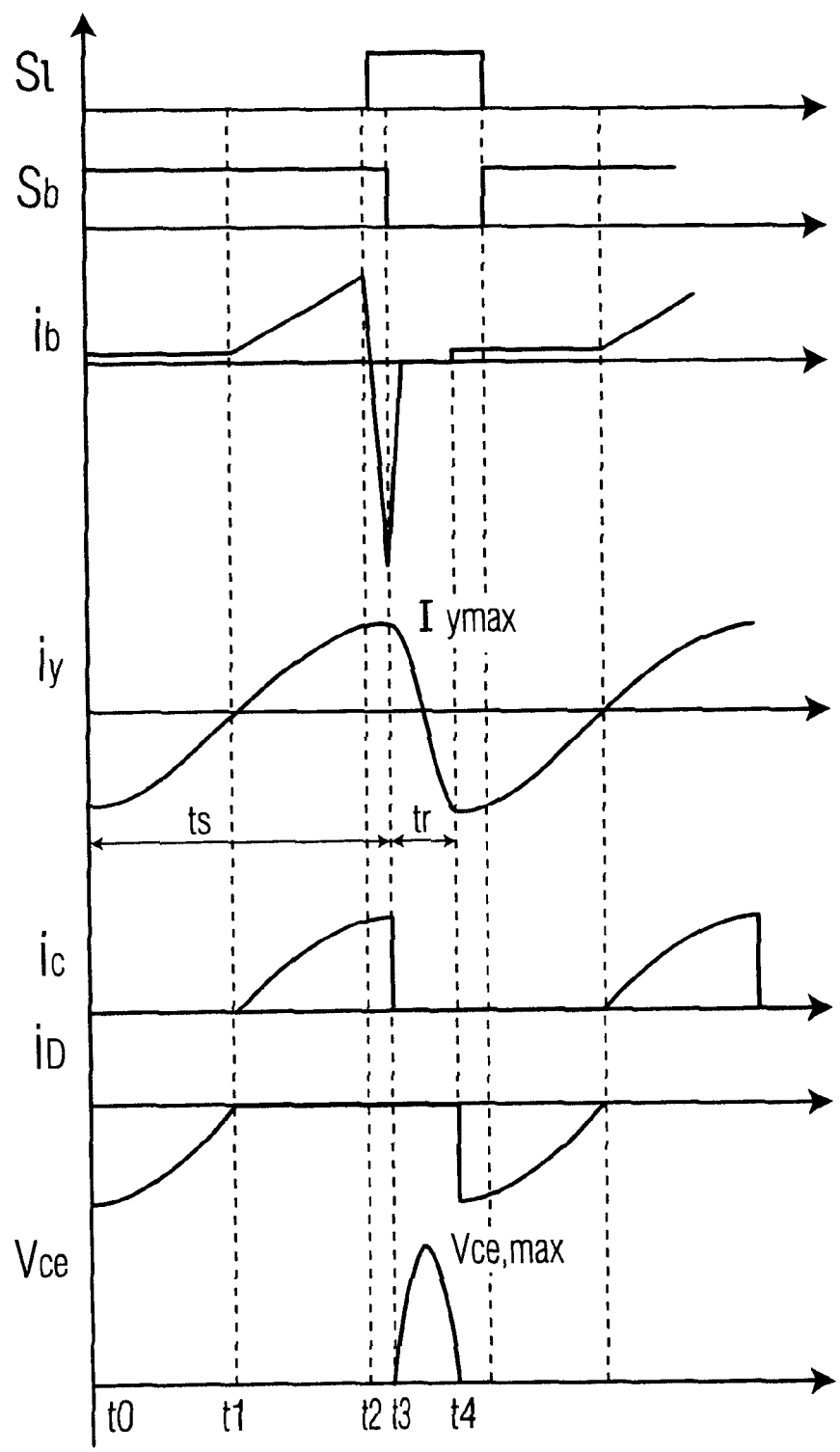
FIG. 4 shows waveforms appearing in the deflection circuit of FIG. 3.

In operation, a constant current circuit, comprising the components, R10, R11, R12, DW, C10, C11 and TR, is used to control the base current before the transistor BJT conducts. The required base current is fairly small when the BJT conducts a small collector current before $t_1$ as shown in FIG. 4, when the deflection coil current becomes positive. Thus, the value of the current source $i_1$ is only a few milliamperes, which consequently causes a significant loss reduction in the base drive circuit. The constant current circuit is independent of the/operation frequency. As a result, this base drive circuit is able to operate with a-wide range of frequency while maintaining minimum power loss. In the subject invention, the base current is even lower than in the prior art during the time interval $t_0$ and $t_1$ than during the time period between $t_1$ and $t_2$. Therefore, the base current is significantly reduced, which reduces the power dissipation. After $t_1$, the transistor BJT begins to conduct the deflection coil current. The windings $N_2$ and $N_3$ are tightly coupled. Based on Ampere's law, the base current $i_b$ is give by:

$$i_b = \frac{N_3}{N_2} i_c \quad (2)$$

The base current of the transistor BJT is primarily provided by part of the collector current. If the turns ratio between windings $N_2$ and $N_3$ is properly chosen and equals the current gain of the transistor BJT, for instance, 5, then energy supplied to the base is not from the drive supply $V_c$, but from the deflection circuit. Furthermore, the base current $i_b$ is proportional to the collector current according to Equation (2), which is good for the transistor BJT to operate efficiently. The voltage drop across the winding $N_3$ is given by $$\frac{N_3}{N_2} V_{be},$$

where $V_{be}$ is the forward biased voltage drop across the base-emitter, typically around 1.0 V. Hence, the voltage drop across the winding $N_3$ is approximately 0.2 V, and will not affect the linearity of the deflection coil current.

Since the transistor BJT is a minority carrier power device, it has a fairly long storage time, which is also dependent on various parameters. This will make control system more complicated. Besides, the transistor BJT has a relatively high tail current when it is turned off, which causes high turn-off switching loss. In the circuit of the subject invention, a fast switch device, MOSFET $S_b$, is in series with the transistor BJT to speed up the turn-off process of the transistor BJT. Once MOSFET $S_b$ is turned off, it cuts the emitter current immediately and no tail current flows through the transistor BJT. As a result, the power loss due to the tail current is greatly reduced. Besides, by properly controlling the switching timing of the MOSFET $S_b$, the storage time is also controllable and storage time tolerance can be eliminated. As shown in FIG. 4, when switch S1 is turned on, the supply voltage $V_c$ is provided to the primary winding $N_1$, which induces a negative voltage across winding $N_2$. This negative voltage will give a negative bias voltage to the base-emitter to turn off the transistor BJT. Since there are extra minority carriers in the collector N-region and the emitter, a negative base current drives these minority carriers out of the emitter and collector. At $t_3$, MOSFET $S_b$ is turned off, which cuts the emitter current of the transistor BJT. As a result, the negative base is equal to the collector current, flows out of the base to speed up the turn-off process. Because the MOSFET $S_b$ turn-off speed is much faster than the transistor BJT, the switching loss in the transistor BJT is significantly reduced. Once the minority carriers are all out of from the collector, the transistor BJT is basically turned off, and the deflection coil current begins to resonate with the capacitor $C_r$, which increases the voltage $V_{ce}$ in a sinusoidal form. The high voltage $V_{ce}$ will reset the deflection coil current to a negative value until $t_4$, where the anti-parallel diode $D_r$ starts conducting.

Tests have shown that the power loss in the base drive circuit is less than 1 watt, while prior art circuits exhibited over 4 watts power loss with 85 kHz operation frequency and 6 A yoke current. In addition, the storage time of the BJT transistor is also significantly reduced by properly controlling the timing of the MOSFET Sb. Due to the emitter switch Sb, there is no tail current of the BJT transistor so as to reduce the switching loss.

Figure 5:
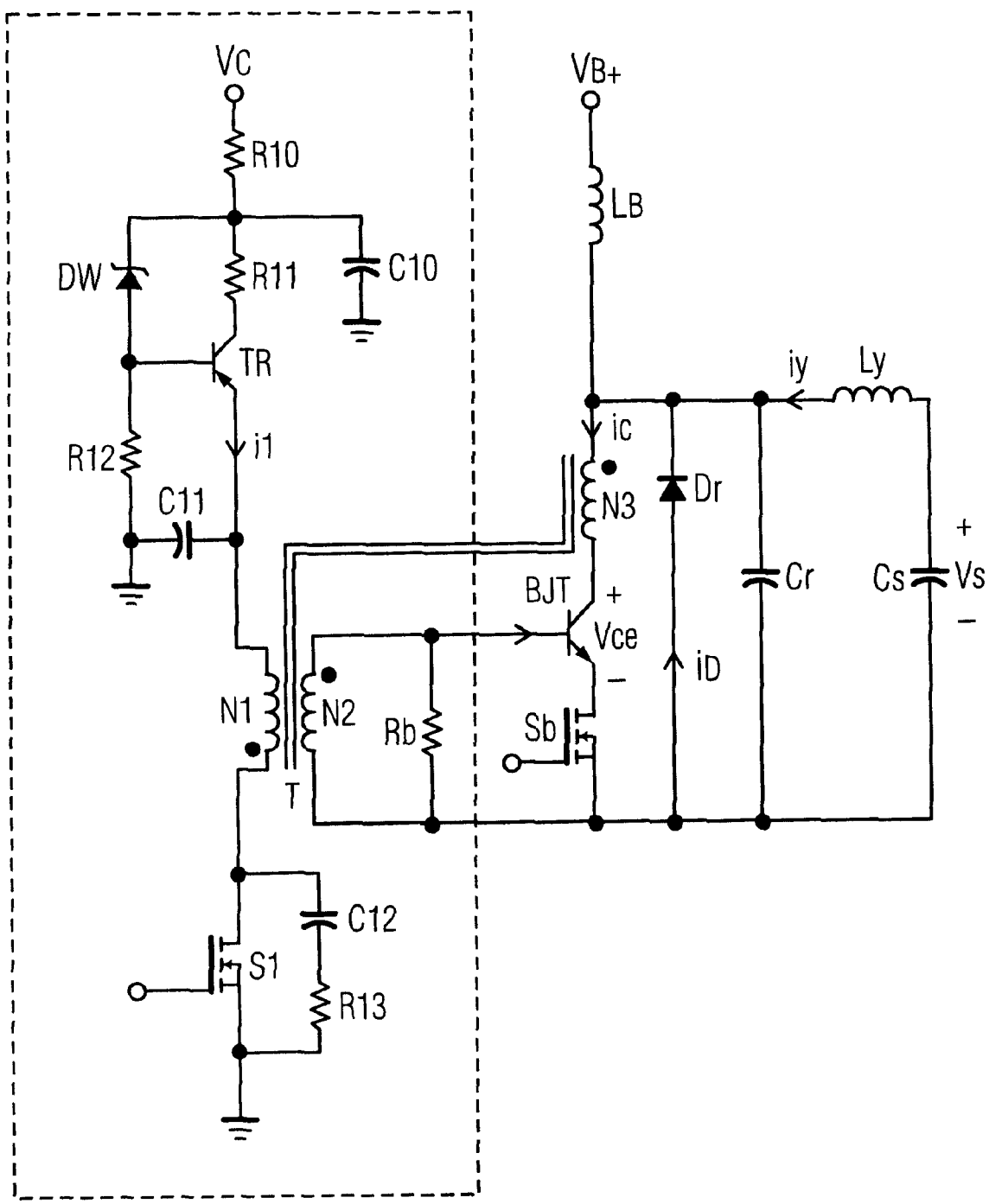
FIG. 5 shows a second embodiment of the deflection circuit of the subject invention.

FIG. 5 shows a second embodiment of the invention which has a substantially similar performance as that of FIG. 3. In this embodiment, the coupling winding N3 is connected to the collector terminal of the BJT transistor, as opposed to the emitter terminal. Therefore, the source of MOSFET Sb is connected to ground and no gate isolation transformer or level shifter for MOSFET Sb is need, compared with the embodiment of FIG. 3. The result is that cost can be further reduced.

Figure 6:
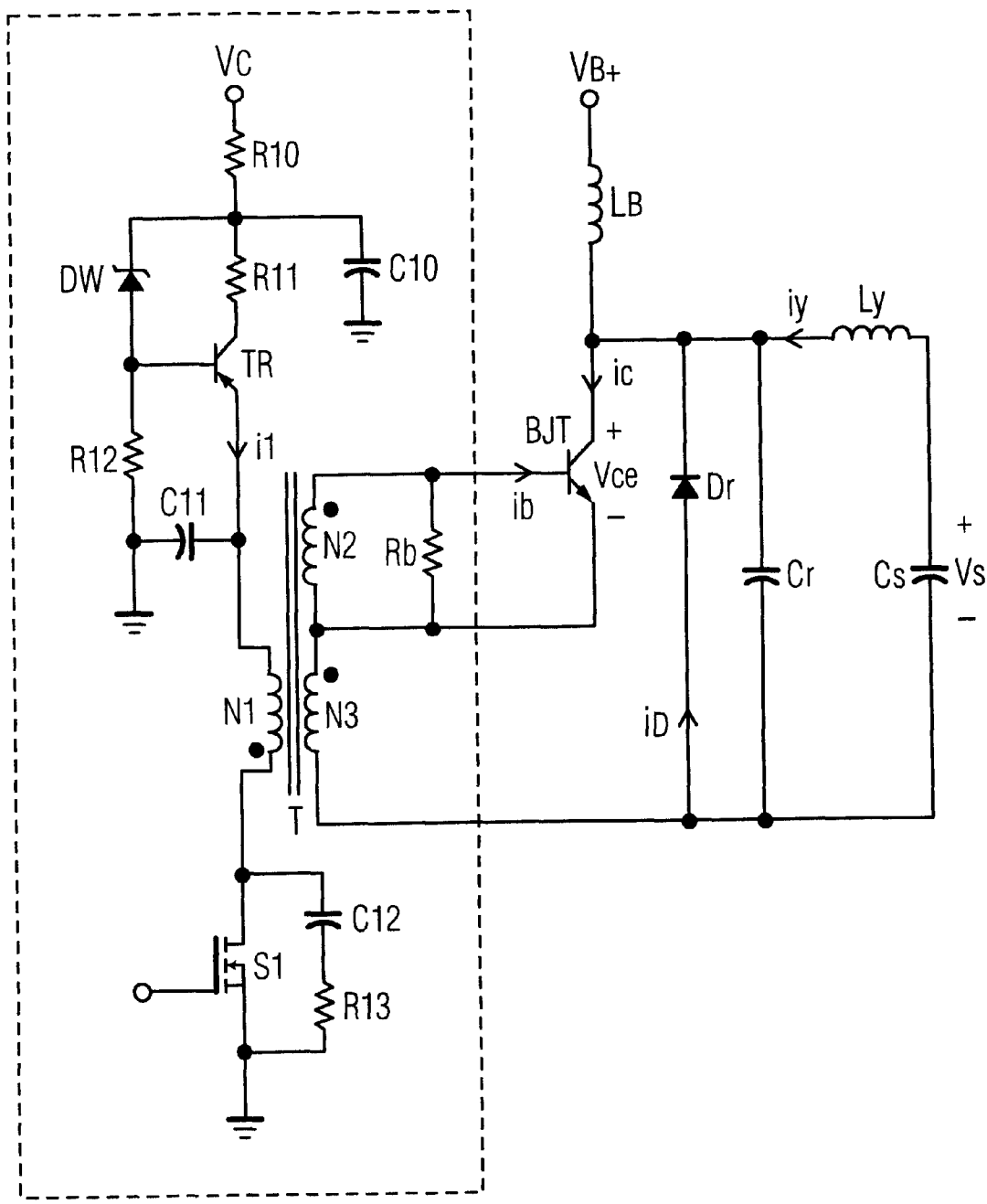
FIG. 6 shows a third embodiment of the deflection circuit of the subject invention.

FIG. 6 shows a third embodiment of the invention which again has a substantially similar performance as that of FIG. 3. In this embodiment, there is no emitter open switch connected to the emitter of the transistor BJT, as such, the MOSFET Sb has been eliminated. While this implementation further reduces cost, it has higher switching losses as compared with the circuits of FIGS. 3 and 5.

Numerous alterations and modifications of the structure herein disclosed will present themselves to those skilled in the art. However, it is to be understood that the above described embodiment is for purposes of illustration only and not to be construed as a limitation of the invention. All such modifications which do not depart from the spirit of the invention are intended to be included within the scope of the appended claims.

What is claimed is:

1. A monitor deflection circuit comprising:
   a bipolar power transistor having a base, an emitter and a collector;
   a high voltage supply for providing a high voltage, said high voltage supply being coupled to the emitter of said bipolar power transistor;
   a parallel arrangement of a retrace capacitor and a damping diode arranged across the emitter and the collector of the bipolar power transistor;
   a series arrangement of a horizontal deflection yoke and an S-correction capacitor also arranged across the emitter and the collector of the bipolar transistor; and
   a base driver circuit for driving the base of the bipolar power transistor, said base driver circuit including a flyback transformer having a primary winding and a secondary winding coupled to the base of the bipolar power transistor, a voltage source coupled to one end of the primary winding, and a drive switch coupling the other end of the primary winding to ground, wherein the base driver circuit further comprises:
   a constant current circuit coupled between the voltage source and the primary winding of the flyback transformer for controlling a base current of the bipolar power transistor before the bipolar power transistor conducts.

2. The monitor deflection circuit as claimed in claim 1, wherein the constant current circuit comprises:
   a pnp transistor having a base, an emitter and a collector, the emitter of the pnp transistor being connected to the primary winding;
   a series arrangement of a first and a second resistor connecting the voltage source to the collector of the pnp transistor;
   a first capacitor coupling a junction between the first and second resistors to ground;
   a Zener diode connecting said junction to the base of the pnp transistor; and
   a series arrangement of a third resistor and a second capacitor connecting the base of the pnp transistor to the emitter, a junction between the third resistor and the second capacitor being connected to ground.

3. The monitor deflection circuit as claimed in claim 2, wherein the base driver circuit further comprises a series arrangement of a fourth resistor and a third capacitor arranged across the drive switch.

4. The monitor deflection circuit as claimed in claim 1, wherein said monitor deflection circuit further comprises:
   a fast switching device arranged in series with the collector-emitter path of said bipolar power transistor, whereby said fast switching device speeds up the turn-off process of the bipolar power transistor.

5. The monitor deflection circuit as claimed in claim 4, wherein said fast switching device is a MOSFET.

6. The monitor deflection circuit as claimed in claim 4, wherein said flyback transformer comprises serially arranged first and second secondary windings, the base-emitter path of said bipolar power transistor and said fast switching device being coupled across said first secondary winding, and said parallel arrangement of said damping diode and said retrace capacitor, as well as said series arrangement of said yoke and said S-correction capacitor, being arranged across the collector-emitter path of said bipolar power transistor and said second secondary winding.

7. The monitor deflection circuit as claimed in claim 4, wherein said flyback transformer comprises serially arranged first and second secondary windings, the base-emitter path of said bipolar power transistor and said fast switching device being coupled across said first secondary winding, and said second secondary winding being arranged in series with the high voltage supply and the emitter of said bipolar power transistor, said parallel arrangement of said damping diode and said retrace capacitor, as well as said series arrangement of said yoke and said S-correction capacitor, being arranged across the second secondary winding, the collector-emitter path of the bipolar power transistor and the fast switching device.

8. The monitor deflection circuit as claimed in claim 1, wherein said flyback transformer comprises serially arranged first and second secondary windings, the base-emitter path of said bipolar power transistor being coupled across said first secondary winding, and said parallel arrangement of said damping diode and said retrace capacitor, as well as said series arrangement of said yoke and said S-correction capacitor, being arranged across the collector-emitter path of said bipolar power transistor and said second secondary winding.

9. The monitor deflection circuit as claimed in claim 2, wherein said monitor deflection circuit further comprises:
   a fast switching device arranged in series with the collector-emitter path of said bipolar power transistor, whereby said fast switching device speeds up the turn-off process of the bipolar power transistor.

10. The monitor deflection circuit as claimed in claim 9, wherein said fast switching device is a MOSFET.

11. The monitor deflection circuit as claimed in claim 9, wherein said flyback transformer comprises serially arranged first and second secondary windings, the base-emitter path of said bipolar power transistor and said fast switching device being coupled across said first secondary winding, and said parallel arrangement of said damping diode and said retrace capacitor, as well as said series arrangement of said yoke and said S-correction capacitor, being arranged across the collector-emitter path of said bipolar power transistor and said second secondary winding.

12. The monitor deflection circuit as claimed in claim 9, wherein said flyback transformer comprises serially arranged first and second secondary windings, the base-emitter path of said bipolar power transistor and said fast switching device being coupled across said first secondary winding, and said secondary winding being arranged in series with the high voltage supply and the emitter of said bipolar power transistor, said parallel arrangement of said damping diode and said retrace capacitor, as well as said series arrangement of said yoke and said S-correction capacitor, being arranged across the second secondary winding, the collector-emitter path of the bipolar power transistor and the fast switching device.

13. The monitor deflection circuit as claimed in claim 2, wherein said flyback transformer comprises serially arranged first and second secondary windings, the base-emitter path of said bipolar power transistor being coupled across said first secondary winding, and said parallel arrangement of said damping diode and said retrace capacitor, as well as said series arrangement of said yoke and said S-correction capacitor, being arranged across the collector-emitter path of said bipolar power transistor and said second secondary winding.

14. The monitor deflection circuit as claimed in claim 3, wherein said monitor deflection circuit further comprises:
a fast switching device arranged in series with the collector-emitter path of said bipolar power transistor, whereby said fast switching device speeds up the turn-off process of the power transistor.

15. The monitor deflection circuit as claimed in claim 14, wherein said fast switching device is a MOSFET.

16. The monitor deflection circuit as claimed in claim 14, wherein said flyback transformer comprises serially arranged first and second secondary windings, the base-emitter path of said bipolar power transistor and said fast switching device being coupled across said first secondary winding, and said parallel arrangement of said damping diode and said retrace capacitor, as well as said series arrangement of said yoke and said S-correction capacitor, being arranged across the collector-emitter path of said bipolar power transistor and said second secondary winding.

17. The monitor deflection circuit as claimed in claim 14, wherein said flyback transformer comprises serially arranged first and second secondary windings, the base-emitter path of said bipolar power transistor and said fast switching device being coupled across said first secondary winding, and said secondary winding being arranged in series with the high voltage supply and the emitter of said bipolar power transistor, said parallel arrangement of said damping diode and said retrace capacitor, as well as said series arrangement of said yoke and said S-correction capacitor, being arranged across the second secondary winding, the collector-emitter path of the bipolar power transistor and the fast switching device.

18. The monitor deflection circuit as claimed in claim 3, wherein said flyback transformer comprises serially arranged first and second secondary windings, the base-emitter path of said bipolar power transistor being coupled across said first secondary winding, and said parallel arrangement of said damping diode and said retrace capacitor, as well as said series arrangement of said yoke and said S-correction capacitor, being arranged across the collector-emitter path of said bipolar power transistor and said second secondary winding.

\* \* \* \* \*